United States Patent [19]

Forstner et al.

[11] 4,431,891
[45] Feb. 14, 1984

[54] ARRANGEMENT FOR MAKING CONTACT BETWEEN THE CONDUCTOR TRACKS OF PRINTED CIRCUIT BOARDS WITH CONTACT PINS

[75] Inventors: Anton Forstner, Dietikon; Imre Bajka, Niederglatt, both of Switzerland

[73] Assignee: Siemens-Albis AG, Zurich, Switzerland

[21] Appl. No.: 229,592

[22] PCT Filed: May 8, 1980

[86] PCT No.: PCT/CH80/00054
§ 371 Date: Jan. 8, 1981
§ 102(e) Date: Jan. 8, 1981

[87] PCT Pub. No.: WO80/02662
PCT Pub. Date: Dec. 11, 1980

[30] Foreign Application Priority Data

Jun. 5, 1979 [CH] Switzerland ............ 5195/79

[51] Int. Cl.³ .................. H05B 6/10; B23K 1/00
[52] U.S. Cl. .................... 219/9.5; 219/10.43; 219/10.57; 219/10.79; 29/837; 228/180 R
[58] Field of Search ........ 219/9.5, 10.43, 10.57, 219/10.79, 85 A, 10.71, 10.73; 29/837, 838, 839, 843, 845; 228/180 R

[56] References Cited

U.S. PATENT DOCUMENTS

| | | | |
|---|---|---|---|
| 2,525,336 | 10/1950 | Bierwirth | 219/85 A X |
| 2,777,041 | 1/1957 | Dustman | 219/10.79 |
| 3,070,683 | 12/1962 | Moro-Lin et al. | 219/85 A X |
| 3,617,682 | 11/1971 | Hall | 219/85 A X |
| 3,619,540 | 11/1971 | Soworowski | 219/10.57 X |
| 3,659,069 | 4/1972 | Balzer et al. | 219/10.79 |
| 4,327,265 | 4/1982 | Edinger et al. | 219/9.5 X |

FOREIGN PATENT DOCUMENTS 2257003 5/1974 Fed. Rep. of Germany.
2739418 3/1979 Fed. Rep. of Germany.

OTHER PUBLICATIONS

Willard, "Induction Stacking", IBM Technical Disclosure Bulletin, vol. 11, No. 6, Nov. 1968.

*Primary Examiner*—Roy N. Envall, Jr.
*Assistant Examiner*—Philip H. Leung
*Attorney, Agent, or Firm*—Werner W. Kleeman

[57] ABSTRACT

The arrangement comprises a support at which there is mounted an induction loop through which flows a high-frequency alternating current. By displacing the support or the circuit board possessing the contact pins which are to be soldered, a multiplicity of contact pins at which contact is to be made are simultaneously brought together with the solder material and the solder eyelets of the contact locations into the range of influence of the magnetic alternating field. By appropriately constructing the induction loop there is obtained a simultaneous uniform heating of the contact pins and the contact locations. The arrangement thus renders possible a simultaneous faultless soldering of the contact pins of one or a number of pin rows of multipoint connectors mounted at the circuit boards.

8 Claims, 6 Drawing Figures

ARRANGEMENT FOR MAKING CONTACT BETWEEN THE CONDUCTOR TRACKS OF PRINTED CIRCUIT BOARDS WITH CONTACT PINS

BACKGROUND OF THE INVENTION

The present invention relates to an arrangement for making contact between the conductor tracks of printed circuit boards with contact pins which are inserted into bores of the printed circuit boards and which are electrically conductively connected with the conductor tracks by means of bodies formed of solder material, arranged at the region of the locations where contact is to be made, by the infeed of heat.

In devices of the telecommunication and data processing art there are used at the present time so-called rear wall printed circuit boards. These single or also multilayer plates constitute printed circuits which are employed in frames at the rear wall and at which there are applied connections in the form of conductor tracks which are present between the structural groups equipped with components and mounted in the frame. Furthermore, these plates are employed for intermeshing the supply voltages and the reference potential. A rear wall printed circuit board possesses a multiplicity of multipoint connectors whose contact pins arranged in rows piercingly extend through holes provided at the rear wall printed circuit board and are electrically conductively connected with the conductor tracks. The structural groups are mounted in the frame by being fitted on to such multipoint connectors. The contact pins protruding out of the rear wall printed circuit board at the rear side of the frame render possible in a simple manner, the establishment of additional connections between certain circuit points, for instance according to known solderfree techniques, such as winding, crimp or clamp connections.

There exists the problem of reliably making contact in the most rational manner between the numerous contact pins of such multipoint connectors with the plug points at the rear wall printed circuit board, i.e. establishing a faultless electrical connection between the contact pin and the conductive material at the printed circuit board. It is not possible to employ an individual soldering according to conventional techniques, since, on the one hand, with the multiplicity of points where contact should be made there is no longer possible any rational mode of operation, and on the other hand, the spacing between the individual contact pins, which becomes increasingly smaller with the continuously progressive miniaturisation, renders questionable a reliable contact making between the individual contact pins. Equally contact making by means of a solder bath is not possible since in doing so the contact pins themselves are coated with the solder in an undesired manner. For overcoming these difficulties there has been proposed in German Patent Publication No. 2,257,003 an apparatus for making contact between conductor tracks extending upon a printed circuit board and contact elements, wherein there is provided a radiation source such as, for instance, a halogen lamp whose radiation thermal energy is infed to the contact locations provided with a soldering agent. The focusing and infeed of the thermal radiation to the contact locations is accomplished with focusing means, and additionally there is provided a transport device which successively brings the locations where the contact is to be made at the printed circuit board into the operable range of the radiation source for a certain period of time. With this equipment it is only possible to simultaneously solder one contact location, which requires an appreciable expenditure in time when encountering a large number of contact locations. A further unfavorable circumstance which exists with such apparatus resides in the fact that particularly in the case of small spacing of the contact locations there is not only undertaken heating of the desired contact location, but also there can arise heating at its direct surroundings and thus, possibly their extending conductor tracks as well as the carrier material of the printed circuit boards can become adversely affected.

SUMMARY OF THE INVENTION

The present invention therefore has for its object providing an arrangement of the previously mentioned type which, in contrast to the known apparatus, renders possible simultaneous soldering of a multiplicity of contact locations and wherein there can be realised a directed thermal action at such contact locations. This is accomplished according to the invention by using an arrangement as the same is characterised in the claims.

By appropriately constructing the induction loop it is possible, with this arrangement, to obtain a uniform energy distribution and thus to simultaneously infeed the same thermal energy to all contact locations which are incorporated into a soldering operation. As a result there is realised in an advantageous manner reduced soldering time, and thus there is also reduced the danger of overheating of contact locations and their direct surroundings.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE DRAWINGS

Figure 1:
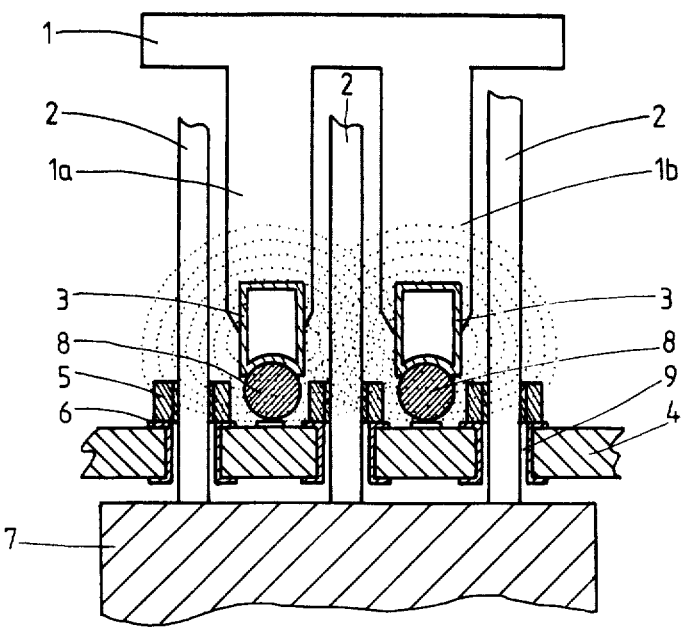
FIG. 1 is a principle illustration of the arrangement.

In FIG. 1 there is illustrated in sectional view a printed circuit board 4 having holes serving as passages 9 through which extend the contact pins or leads 2 arranged upon an insulating body 7 of a multipoint connector. The multipoint connector comprises a number of mutually parallel rows of contact pins 2. The passages 9 are advantageously through-contacted i.e. continuously covered with a conductive material which is electrically conductively connected with appropriate conductor tracks at the printed circuit board. To establish an electrical connection between the contact pins 2 and the passages 9 there are provided solder rings 5 which are placed over the pins 2. The arrangement for making contact essentially consists of a support or support member 1 having two mutually parallel extending legs 1a, 1b, at which there are mounted partial elements of an induction loop 3 which in this case is of approximately rectangular configuration. The loop consists of a copper tube having a rectangular-shaped cross-section through which flows a cooling liquid, for instance water. The induction loop 3 is connected with a high-frequency generator and therefore generates an electromagnetic alternating field, the course of which has been indicated by points in FIG. 1. By not further illustrated means it is possible to displace the support 1 in relation to the printed circuit board 4 or vice versa. In particular the support 1 can be lowered on to the printed circuit board 4 into the position shown in FIG. 1. In this position the intermediate row of contact pins 2 is surrounded by both legs 1a, 1b. As a result, the contact pins 2, the solder rings 5 and solder eyelets 6 of the contact location come into the range of influence or effective zone of the magnetic alternating field, resulting in heating thereof by eddy currents which arise in known manner. The thermal energy produced in the contact pins 2 additionally is transmitted to the solder rings 5. Consequently these are caused to melt and there thus is accomplished contact making of the related contact pin 2 with the conductor tracks upon the printed circuit board 4. The thermal transmission which is brought about in this manner between the contact pins 2 and the solder rings 5 causes, in advantageous manner that only those elements of the contact location are heated which actually should be heated. The non-conductive material of the printed circuit boards surrounding the contact locations is thus not affected—apart from the negligible radiation heat. With this arrangement it is possible to simultaneously solder a multiplicity of contact pins 2. As a result there is realised a rational mode of operation which, with the aid of a fully automatic position control of the support 1 and the printed circuit board 4, respectively, can be further optimised. The inventive arrangement can be also readily employed for making contact at contact locations whose bores are not through-contacted.

Figure 2A:
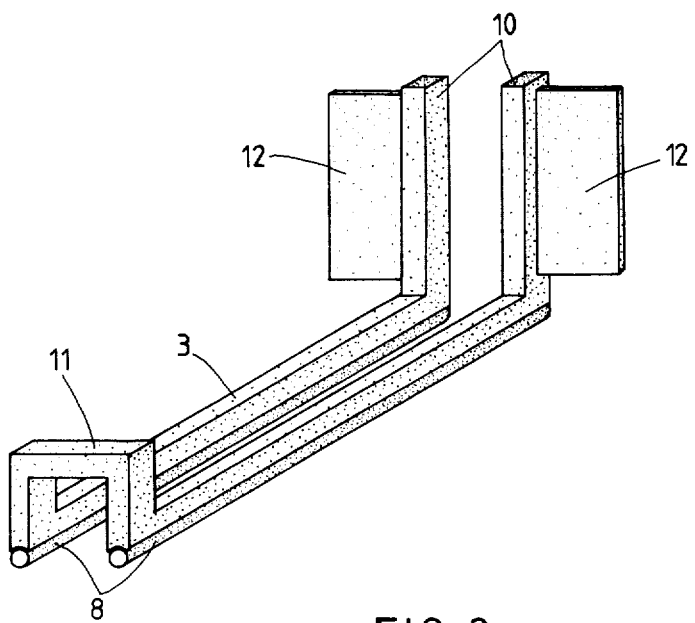
FIG. 2a illustrates details of the induction loop or coil.

In FIG. 2a there are illustrated further details of the induction loop 3. This induction loop 3 is particularly designed for the simultaneous contact making at one or a number of rows of contact pins 2. At the connection side with the infeed lines 10 there are connected by not further illustrated means both the aforementioned high-frequency generator and also the cooling water system. The loop end located opposite the connection side contains a U-shaped web 11 which, in relation to the contact locations which are to be soldered, forms an elevated connection between both of the parallel lengthwise or long portions of the induction loop 3. This manner of constructing the loop end is predicated upon the following reasons: If the loop end is designed without any upstanding web 11, i.e. if the connection portion at the loop end is located in the same plane as both of the lengthwise portions, then the magnetic field formed at the region of the loop end has a greater field line density than that at the remaining loop. The increased energy concentration resulting therefrom at the loop end endangers the contact pins located at such region during the soldering operation in that such are heated to impermissible temperatures and therefore can become damaged due to incandescence thereof. With the upstanding web 11 at the loop end it is possible to reduce to a permissible value the undesired energy concentration and the amount that the web 11 is upwardly extended in relation to the lengthwise portions or parts of the loop 3 is to be selected in accordance with the conditions encountered from case to case.

The infeed lines 10 at the connection side of the induction loop 3 are located at least approximately perpendicular to the lengthwise portions for the sake of providing as compact an arrangement as possible. There also is formed at this side of the loop 3 a region having increased energy concentration which, during the soldering operation, can endanger the contact pins 2 located at such region. This danger can be counteracted in that there are mounted at the infeed lines 10 vanes 12, for instance formed of copper, which are located perpendicular to the direction of the magnetic field lines enclosing the infeed lines 10. In this way there is realised a reduction of the inductance of the infeed lines 10 and a reduction of an energy concentration at such region. At the same time there is obtained an increase of the energy concentration at the region of the lengthwise portions of the induction loop 3.

Figure 2B:
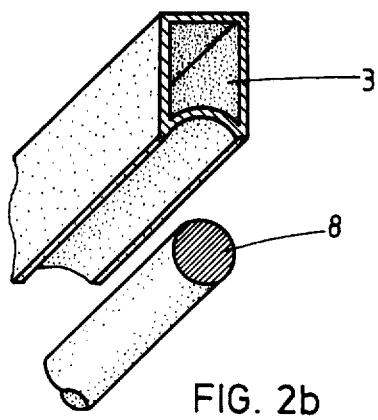
FIG. 2b illustrates the application of a ferrite material to the induction loop or coil.
Figure 3A:
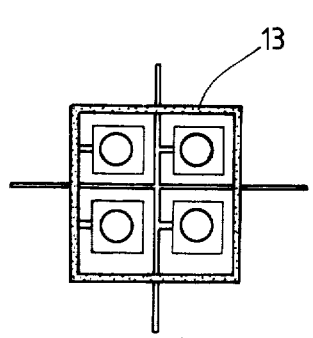
FIG. 3a illustrates in conventional manner the network or grid-like arranged conductor tracks of a printed circuit board.

Additionally there exists the danger that the magnetic alternating field generated by the induction loop 3 also can cause in undesired manner, eddy currents at the conductor track sections located at the printed circuit board 4, which can result in an impermissible heating-up with subsequent destruction of such conductor. Consequently, there are particularly endangered conductor tracks extending directly at the neighborhood of the pins 2 where contact is to be made at the side of the circuit board confronting the induction loop 3. Such conductor tracks are particularly found at printed circuit boards in known manner in the form of network-like or grind-like arranged ground and supply lines 13 (FIG. 3a). To eliminate this danger the side of the lengthwise portions of the induction loop 3, confronting the printed circuit board 4, is covered with a ferrite material 8. In this way it is possible to alter the course of the magnetic field lines in a manner such that their influence upon the aforementioned conductor tracks can be effectively reduced or even eliminated. The change of the field line course has been shown in FIG. 1 by dots. In FIG. 2b there is illustrated a possibility of applying the ferrite material 8. Here, the preferably rod-shaped ferrite material 8 is mounted into a domed portion of the induction loop 3, and the depth of the arching on the one hand and the diameter of the ferrite material 8 on the other hand governs the shortest possible spacing of the induction loop 3 from the printed circuit board 4.

In fields of application where the mentioned increased energy concentration at the region of the loop end does not cause any endangering of surrounding elements, it is possible to dispense with the use of the web 11, which not least of all renders possible a simplified fabrication of the induction loop 3. In such cases the connection between both lengthwise portions is arranged at the same height as such lengthwise portions. Under circumstances it can then be sufficient to also cover such connection with the ferrite material 8, in order to obtain the required protective action. Moreover, it is further to be mentioned that the ferrite material 8 need not be mounted in every case at the under side of the induction loop 3 which confronts the printed circuit board 4. It is completely conceivable, depending upon the prevailing conditions in a certain field of application, to mount the ferrite material 8 also at the top side or laterally at the induction loop 3 and thus to obtain the desired protective action.

Figure 3B:
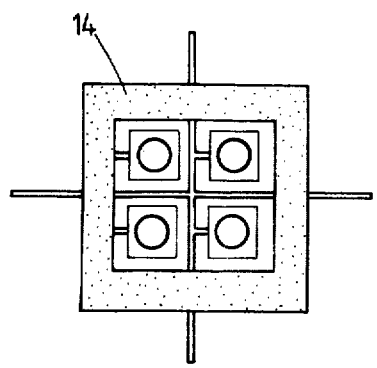
FIG. 3b illustrates an improvement of such network or grid-like structure in conjunction with the inventive arrangement.

In many cases, notwithstanding the previously described measures, it is impossible to avoid, because of the extremely narrow space conditions, that conductor tracks will arrive at the region of influence or action of the magnetic field generated by the induction loop 3 and will become destroyed by virtue of excessive heating. The gorund grid conductor tracks 13 illustrated in FIG. 3a, which as a rule are relatively narrow ($\leq 0.5$ mm) can be arranged at the solder side and/or at the assembly side i.e. at the side of the circuit board 4 confronting the induction loop 3. In order to additionally protect such conductor tracks against impermissible heating, it is advantageous to arrange particularly at the solder side at suitable locations as wide as possible border 14 (FIG. 3b) composed of conductive material. This border 14 protects the thin conductor tracks both at the solder side and also at the assembly side in that it withdraws a portion of the undesired thermal energy.

In order to obtain as uniform as possible infeed of thermal energy for all of the pins or leads 2 which are to be acted upon during a solder operation the parallelism of both long partial elements of the induction loop 3 must be maintained within narrow limits ($\pm 0.05$ mm). Only in this way can there be obtained a faultless quality of all solder locations. If these tolerances are not maintained then the built-up energy field becomes irregular, resulting in a prolongation of the solder time, overheated solder locations and thus solder locations of different quality. For insulation purposes the induction loop 3 can be covered with a suitable insulation material, which moreover is heat-resistant. This material which is applied in the form of a foil additionally affords the advantage that residual flowable materials which possibly remain at the loop can be simply and rapidly removed by cleaning the foil.

Figure 4:
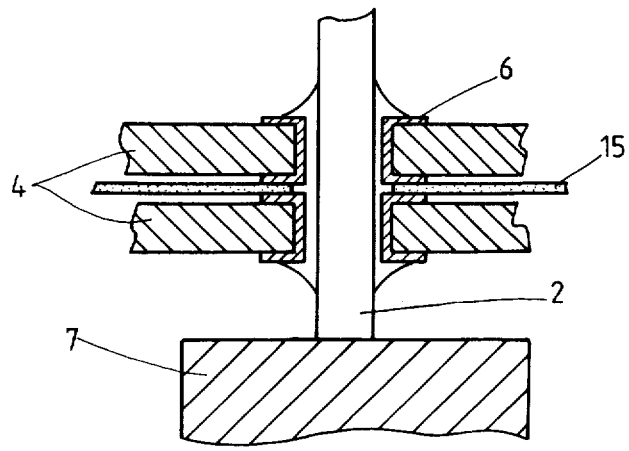
FIG. 4 illustrates a special field of application of the arrangement.

The described solder arrangement can be advantageously employed also in the case of multi-layer printed circuit boards and when arranging a number of printed circuit boards which ar interconnected with one another by the contact pins of the multipoint connectors (multipack arrangement). The principle of a multipack-printed circuit board has been shown in FIG. 4. Between the circuit boards 4 there is incorporated an insulation layer 15. By appropriately selecting the solder time it is possible with the arrangement described on the basis of FIG. 1 to solder with one another in one soldering operation two and more superimposed circuit boards 4 which are separated from one another by an insulation layer. By virtue of the uniform heating of the contact pin rows there is possible the production of solder locations with solder pearls formed at both sides in a faultless manner in that the solder of the solder rings placed at the solder side over the contact pins 2 passes through the through passages of the circuit boards 4. Also in contrast to the previously mentioned known apparatus it is not necessary to successively solder the circuit boards 4 with the contact pins 2, resulting in less expenditure in work.

Instead of using the ferrite material 8 mentioned by way of example during the description of FIGS. 1 and 2, it also of course would be possible to use other materials having appropriate electromagnetic properties, and specifically, preferably such materials which are capable of having imparted thereto any randomly desired form in a simple manner, such as for instance by casting.

While there are shown and described present preferred embodiments of the invention, it is to be distinctly understood that the invention is not limited thereto, but may be otherwise variously embodied and practiced within the scope of the following claims.

What we claim is:

1. An arrangement for making contact between electrical conductor tracks of printed circuit boards and contact pins by heating bodies formed of solder material and arranged at the region of predetermined contact locations where contact is to be made, comprising:
    a displaceable induction loop through which there can flow a high-frequency alternating current in order to generate an electromagnetic alternating field;
    said induction loop possessing an essentially rectangular-shaped configuration and serving to make contact between the conductor tracks of the printed circuit board and contact pins arranged in rows and spaced very closely in relation to one another and inserted into bores of the printed circuit board, said induction loop being adapted to fit between said rows of pins;
    said induction loop having two lengthwise extending portions, a loop end, and a substantially U-shaped web provided at the region of said loop end, said substantially U-shaped web constituting a raised connection in relation to a plane containing both of said lengthwise extending portions of the induction loop;
    a displaceable support member for supporting the induction loop and displaceable with respect to a plane containing the printed circuit board; and
    said lengthwise extending portions of said substantially rectangular-shaped induction loop comprising two substantially mutually parallel extending leg members arranged relative to said displaceable support member such that upon lowering said support member in the direction of said printed circuit board into coacting relationship with one another there is operatively engaged at least one row of the contact pins at which contact is to be made and such contact pins are simultaneously brought together with related contact locations thereof into the effective region of the electromagnetic alternating field of the induction loop and are thereby substantially uniformly heated.

2. The arrangement as defined in claim 1, wherein:
    said induction loop has a connection side;
    said induction loop extending at least approximately parallel to the direction of the contact pins at which contact is to be made at the region of said connection side;
    a respective infeed line provided for the induction loop; and
    at least one vane member provided for each infeed line and extending substantially perpendicular to a plane containing the lengthwise extending portions of the induction loop.

3. The arrangement as defined in claim 2, wherein:
    the lengthwise extending portions of the induction loop are covered at least at a side thereof confronting the printed circuit board with a material having electromagnetic properties.

4. The arrangement as defined in claim 3, wherein:
    said material comprises a ferrite material.

5. The arrangement as defined in claim 1, wherein: the lengthwise extending portions of the induction loop are covered at least at a side thereof confronting the printed circuit board with a material having electromagnetic properties.

6. The arrangement as defined in claim 5, wherein: said material comprises a ferrite material.

7. The arrangement as defined in claim 5, further including:
additional conductive material provided at the printed circuit board at least at a side thereof confronting the induction loop and at the region of the contact locations where contact is to be made.

8. The arrangement as defined in claim 1, wherein: the induction loop is coated with a heat-resistant insulating material.

* * * * *